United States Patent [19]

Kim

[11] Patent Number: 5,461,305

[45] Date of Patent: Oct. 24, 1995

[54] PREPROCESSING CIRCUIT FOR MEASURING SIGNAL ENVELOPE FLATNESS DEGREE IN A REPRODUCER

[75] Inventor: Hyoung-Chul Kim, Suwon, Rep. of Korea

[73] Assignee: Samsung Electronics Co., Ltd., Suwon, Rep. of Korea

[21] Appl. No.: 61,239

[22] Filed: May 17, 1993

[30] Foreign Application Priority Data

Jun. 10, 1992 [KR] Rep. of Korea .................. 1992-10088

[51] Int. Cl.⁶ ............................................ H03D 1/18
[52] U.S. Cl. ........................ 324/76.11; 329/349; 329/364
[58] Field of Search ........................ 307/261; 324/76.11, 324/76.13, 76.82, 76.79, 123 R; 329/349, 364–365, 369, 370; 455/312

[56] References Cited

U.S. PATENT DOCUMENTS

| | | | |
|---|---|---|---|
| 3,811,093 | 5/1974 | DeLeo | 324/76.79 |
| 4,158,882 | 6/1979 | Citta | 329/364 |
| 4,250,457 | 2/1981 | Hofmann | 329/349 |
| 4,258,327 | 3/1981 | Fujimoto | 329/364 |
| 4,485,348 | 11/1984 | Perkins | 329/364 |
| 4,817,154 | 3/1989 | Hoyer | 381/36 |
| 4,890,066 | 12/1989 | Straver et al. | 329/349 |

FOREIGN PATENT DOCUMENTS 1-160261   6/1989   Japan .

*Primary Examiner*—Kenneth A. Wieder
*Assistant Examiner*—Christopher M. Tobin
*Attorney, Agent, or Firm*—Burns, Doan, Swecker & Mathis

[57] ABSTRACT

A signal envelope measurement preprocessing circuit including: input signal adjuster for interdicting a DC component contained in a signal input for measurement of the degree of flatness of an envelope or for passing only frequencies above a predetermined frequency; first and second half-wave rectifiers for separating into upper and lower portions the envelope of a signal output from the input signal adjusting means to thereafter detect the same; first and second frequency converters for converting a high frequency signal respectively from the first and second half-wave rectifiers into a low frequency signal; an analog-to-digital converters for converting a signal selected from low frequency signals output from the first and second frequency converters to a digital signal; and a system controller for comparing a data output from the analog-to-digital converter with a data stored on an internal program to thereafter measure the degree of flatness of a signal envelope.

2 Claims, 2 Drawing Sheets

PREPROCESSING CIRCUIT FOR MEASURING SIGNAL ENVELOPE FLATNESS DEGREE IN A REPRODUCER

BACKGROUND OF THE INVENTION

1. Field of the Invention

The present invention relates to an envelope measurement preprocessing circuit, and more particularly to an envelope measurement preprocessing circuit for converting a high frequency signal reproduced from a reproducer to a low frequency signal to thereby facilitate automatic measurement of the degree of flatness of a signal envelope.

2. Description of the Prior Art

Generally, in order to check an envelope state of a predetermined signal of a reproducer (by way of example, a video tape recorder (VTR)) which picks up and reproduces a data recorded on a recording medium, a user previously visually checked the signal using an oscilloscope or a programmable oscilloscope to thereby perform a sampling on the signal. In this way, the envelope of a signal waveform can be measured from the displayed data.

A conventional checking method of the envelope state thus described has drawbacks in that, firstly, an operational speed is slow and the operation is inaccurate due to the visual measurement. Secondly, a data sampling for measurement of waveform envelope is expensive due to the use of a digital oscilloscope. Thirdly, in a case where a signal necessary for the envelope check has a high frequency and the period thereof is long (by way of example, the frequency in the case of a signal used for an envelope check of VTR ranges, i.e., in the mega-hertz with a period of approximately 30 Hz) sampling must be performed with one period of a waveform divided into several parts due to a scope analysis capacity and, at the same time, a first trigger signal of each interval must adequately generated.

SUMMARY OF THE INVENTION

The present invention has been prepared with above problems taken into account, and it is an object of the present invention to provide an envelope measurement preprocessing circuit which keeps intact the envelope of a signal regenerated and outputted from a signal regenerator or the like and converts only the frequency to a low frequency, so that the degree of flatness of the envelope can be measured even at a low sampling speed.

In accordance with an object of the present invention, the envelope measurement preprocessing circuit comprises: an input signal adjusting means for interdicting a DC component contained in a signal input for measurement of a degree of flatness of an envelope or for passing only frequencies over a predetermined frequency; first and second half-wave rectifying means for separating into upper and lower ranges the envelope of a signal output from the input signal adjusting means to thereafter detect the same; first and second frequency converting means for converting a high frequency signal detected respectively from the first and second half-wave rectifying means into a low frequency signal; and analog-to-digital converting means for converting a signal selected from low frequency signals output from the first and second frequency converting means to a digital signal; and a system controller for comparing a data output from the analog-to-digital converting means with a data stored on an internal program to thereafter measure the degree of envelope flatness.

BRIEF DESCRIPTION OF THE DRAWINGS

For fuller understanding of the nature and objects of the invention, reference should be made to the following detailed description taken in conjunction with the accompanying drawings in which.

DETAILED DESCRIPTION OF THE INVENTION

A preferred embodiment of the present invention will be described in detail with reference to the accompanying drawings.

Figure 1:
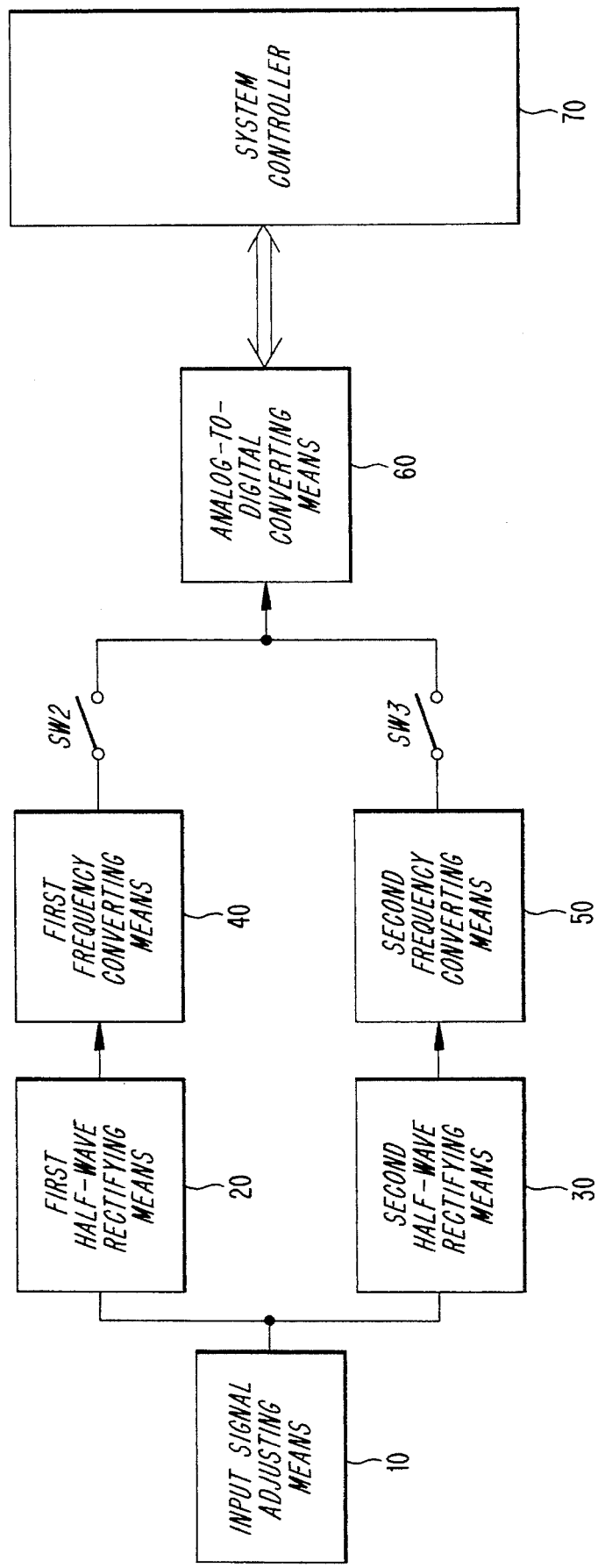
FIG. 1. is a block diagram of an envelope measurement preprocessing circuit in accordance with the present invention.
Figure 2:
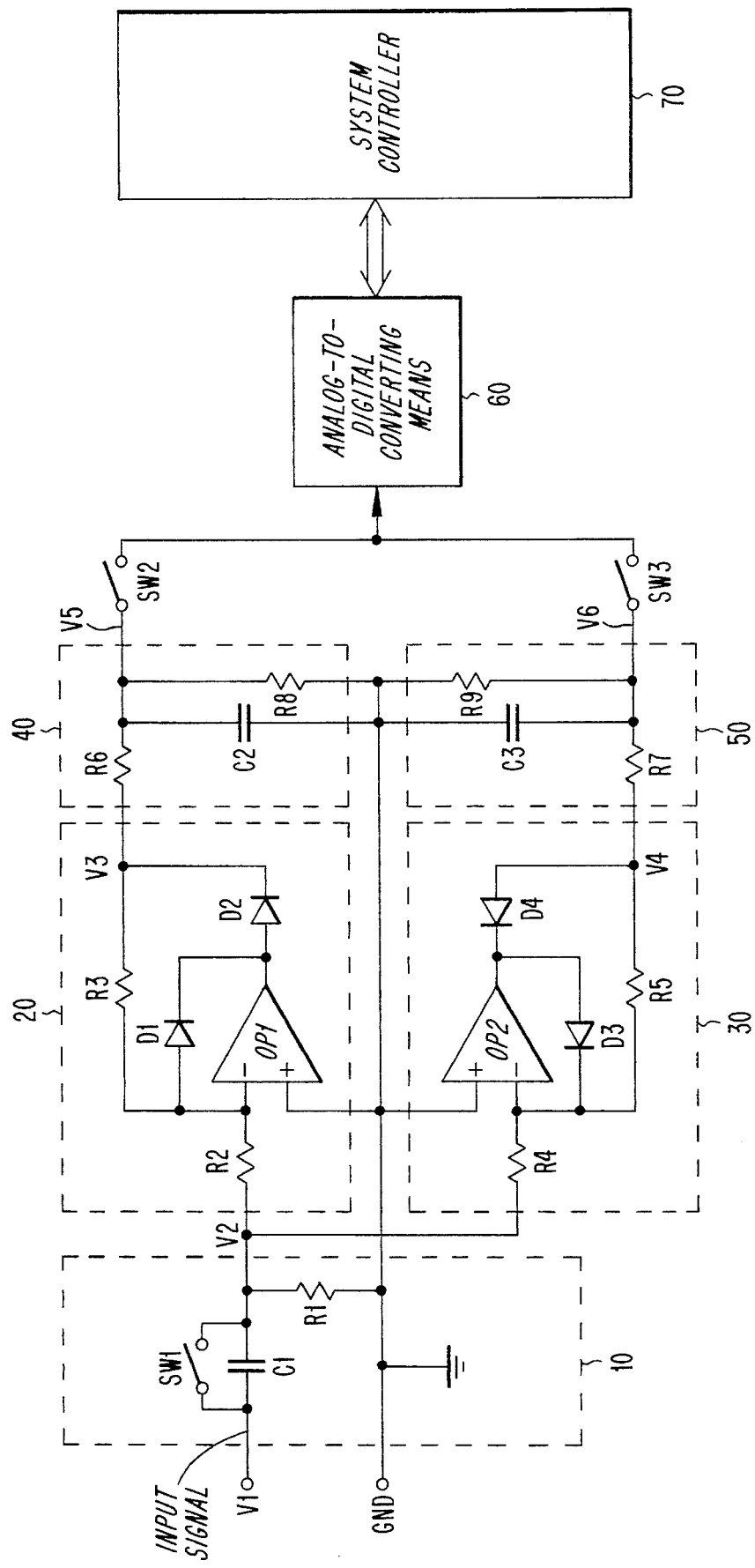
FIG. 2. is a detailed circuit drawing of an envelope measurement preprocessing circuit in accordance the present invention.

As shown in FIGS. 1 and 2, the input signal adjusting means 10 is constructed to connect an output terminal of a regenerator (not shown) to a high pass filter comprising a condenser C1 and a resistor R1, and connects a switch SW1 to both ends of the condenser C1 to thereby selectively interdict or pass a DC component.

The first half-wave rectifying means 20 comprises an operational amplifier OP1 whose transfer function is determined as -R3/R2 by resistors R2 and R3; a diode D1 connected in a forward direction to an inverted terminal and an output terminal of the operational amplifier OP1, and a diode D2 connected in a forward direction to a cathode terminal and an output terminal of a diode D1.

The second half-wave rectifying means 30 comprises an operational amplifier OP2 whose transfer function is determined as -R5/R4 by resistors R4 and R5; a diode D3 connected in a reverse direction to an inverted terminal and an output terminal of the operational amplifier OP2; and a diode D4 connected in a reverse direction to a cathode terminal and an output terminal of the diode D3.

The first frequency converting means 40 comprises a low pass filter having a resistor R6 and a condenser C2 and a resistor R8, so that a high frequency signal measured and output from the first half-wave rectifying means 20 can be converted to a low frequency signal.

The second frequency converting means 50 comprises a low pass filter having a resistor R7 and a condenser C3 and a resistor R9, so that a high frequency signal detected and output from the second half-wave rectifying means 30 can be converted to a low frequency signal.

The analog-to-digital converting means 60 is designed to convert output signals of the first and second frequency converting means 40 and 50 selected by switches SW2 and SW3 to digital signals to thereby supply the same to the system controller 70.

An operational relationship of ,the preprocessing circuit in accordance with the present invention thus constructed will now be described in detail.

In order to measure the degree of flatness of an envelope of a signal V1 regenerated from a regenerator, the signal V1 is supplied to an input terminal of an input signal adjusting means 10 in the preprocessing circuit as illustrated in FIG. 2.

When the switch SW1 is turned off at the input signal adjusting means 10, a DC component is interdicted, and when the switch SW1 is turned on, the input signal V1 having a filtered frequency of less than a predetermined value is supplied respectively to an inverted terminal (−) of the operational amplifiers OP1 and OP2 in the first and second half-wave rectifying means 20 and 30 through resistors R2 and R4.

Meanwhile a ground voltage GND is supplied to a non-inverted terminal (+) of the operational amplifiers OP1 and OP2.

Accordingly, when an input signal V2 applied to the inverted terminal (−) of the operational amplifiers OP1 and OP2 is a positive voltage, an output terminal potential of the operational amplifiers OP1 and OP2 is a "low" level, so that the input signal V2 can be detected from the second half-wave rectifying means 30 thereby to be output.

When the input signal V2 is a negative voltage, the output terminal potential of the operational amplifiers OP1 and OP2 is a "high" level, so that the input signal V2 is detected from the first half-wave rectifying means 20 thereby to be output.

Upper and lower side signals V3 and V4 respectively detected from the first and second half-wave rectifying means 20 and 30 are converted to low frequency signals V5 and V6 by a low pass filter within the first and frequency converting means 40 and 50 thereby to be supplied to the analog-to-digital converting means 60 through selected switches SW2 and SW3.

The switches SW2 and SW3 are to be selected by the user.

When the regenerated signal V1 output from the regenerator is in a higher level than the ground level, the switch SW3 is turned "on", and conversely when the regenerated signal V1 is in a lower level than the ground level, the switch SW2 is turned "on".

As seen in the foregoing, the low frequency signals V5 and V6 inputted to the analog-to-digital converting means 60 are converted to digital signals thereafter to be input to the system controller 70, so that the same can be compared with reference data and the degree of flatness can be measured.

From the foregoing, because the incoming low frequency signals V5 and V6 are lower in frequency than the regenerated signal V1, it should be apparent that the analog-to-digital converting means 60 also can use a slow sampling speed.

As seen from the aforesaid, because the present invention thus constructed detects only a signal of less than or greater than a predetermined value among the signals to be measured, and the detected signal is filtered by a low pass filter to thereby convert the same to a low frequency signal for sampling, an analog-to-digital converter having a slow speed can measure the envelope of a high frequency signal.

What is claimed is:

1. A preprocessing circuit for measuring a signal envelope flatness degree in a reproducer comprising:

input signal adjusting means for interdicting a DC component of a signal input for measurement of a degree of flatness of a current signal envelope or for passing only signals having greater than a predetermined frequency;

half-wave rectifying means for separating an input signal from said input signal adjusting means into positive and negative signal components;

frequency filtering means, connected to said half-wave rectifying means, for filtering said positive and said negative rectified signal components;

analog-to-digital converting means, connected to said frequency filtering means, for converting switched outputs from said frequency filtering means into a digital signal representing the degree of flatness of said input signal;

a system controller for comparing data output from the analog-to-digital converting means with data stored in said system controller to measure the degree of flatness of an envelope of said input signal;

switching means, connected to said frequency filtering means, for selectively switching an output of either said first or second frequency filtering means into said analog-to-digital converting means;

wherein said input signal adjusting means includes a high pass filter and a by-pass switch for selectively interdicting a DC component of an input signal or passing only signals having greater than a predetermined frequency; and wherein said frequency filtering means includes a first frequency filtering means for converting a positive, rectified component of an input signal into a lower frequency signal; and a second frequency filtering means for converting a negative, rectified component of an input signal into a low frequency signal.

2. A circuit according to claim 1, wherein each of said first and second frequency filtering means include a low pass filter.

* * * * *